Nov. 9, 1965 T. C. MILLER 3,216,101

METHOD FOR ASSEMBLING COMPONENTS ON PRINTED CIRCUIT BOARDS

Filed Sept. 16, 1964

INVENTOR
THOMAS C. MILLER
BY Thomas S. Ross
Joseph R. Spalla
ATTORNEYS 3,216,101

METHOD FOR ASSEMBLING COMPONENTS ON PRINTED CIRCUIT BOARDS

Thomas C. Miller, Farmington, Conn., assignor, by mesne assignments, to Royal Typewriter Company, Inc., New York, N.Y., a corporation of Delaware Filed Sept. 16, 1964, Ser. No. 396,991
2 Claims. (Cl. 29—407)

This invention relates to a method for assembling components on printed circuit boards; more particularly it it relates to such a method which is characterized by a light table and component location coded color cards corresponding to each component to be assembled on a printed circuit board and wherein said cards are positioned beneath a printed circuit board so that light passing up through the coded cards will illuminate selected holes in the printed crcuit boards with the color corresponding to the components to be inserted therein.

A feature of the invention resides in the fact that errors in locating components on a printed circuit board are minimized if not entirely eliminated and the assembly of components in accordance with the invention may be accomplished by unskilled workmen without previous training.

Accordingly a broad object of the invention is to provide a method for facilitating the assembly of components at specific predetermined locations on a board such as a printed circuit board.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figure 3:
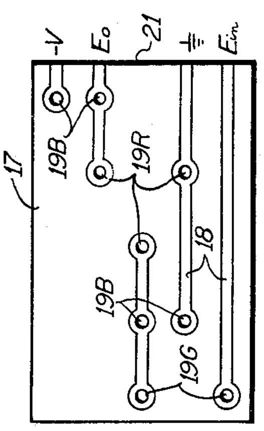
Figure 4:
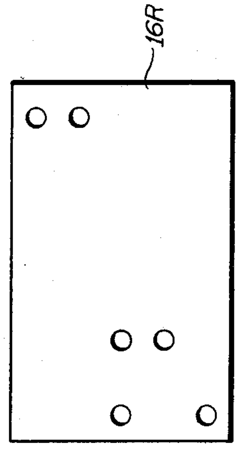
Figures 1, 2:
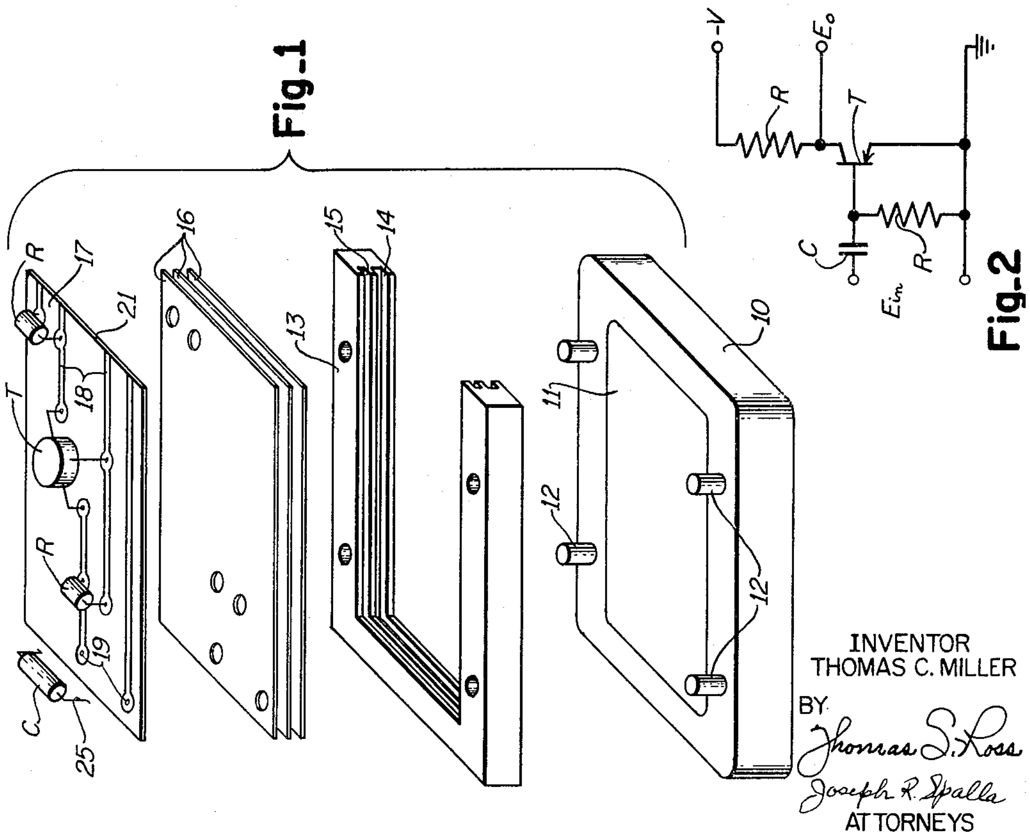
FIGURE 1 is an exploded perspective view showing an operative association of elements employed in the method of the invention.
FIGURE 2 is a circuit diagram.

FIGURE 3 is a plan view of a printed circuit board with a conductor layout designed to accommodate the components of the circuit shown in FIGURE 2; and FIGURES 4. 5 and 6 are plan views of color cards corresponding to components in the circuit of FIGURE 2 coded to dictate to an assembler when placed beneath the printed circuit board the positions on the board that said components are to be located.

Referring now to the drawings wherein like reference numerals designate like or corresponding parts throughout the several views there is shown in FIGURE 1 an enclosure 10 comprising a light diffusing flat top plate 11 overlying a suitable light source within the enclosure. The top corners of the enclosure are provided with upright studs 12 adapted to enter into holes in and to locate a U-shaped frame member 13 placed on top of the enclosure. The inwardly facing sides of the U-shaped frame member are provided with vertically spaced grooves 14 and 15 for the reception from the open side of the frame of one or more transparent coded color cards 16 and for the reception of a printed circuit board 17 respectively; the space between board and cards accommodating component leads inserted in the board. As will be understood in the art, and as illustrated in FIGURE 3, the printed circuit board is made of insulating material and carries a conductive pattern or intercomponent conductors 18 designed to accommodate the components in the circuit of FIGURE 2. The conductive pattern which may be applied by any of several known techniques is characterized by a plurality of enlarged areas which surround and extend into thereby coating the walls of holes 19 drilled through the board to accommodate components. In usual practice the holes are drilled at $\frac{1}{10}''$ intervals or multiples thereof as required. As shown in FIGURES 1 and 3 the conductive pattern 18 has segments extending to one edge 21 of the board whereby power may be supplied to the components and whereby input signals $E_{in}$ may be coupled to and output signals $E_o$ derived therefrom.

Figure 5:
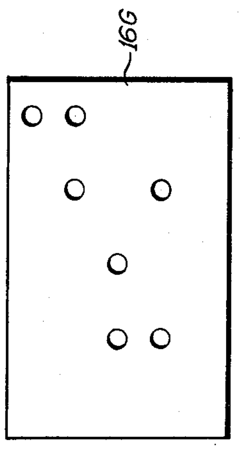
Figure 6:
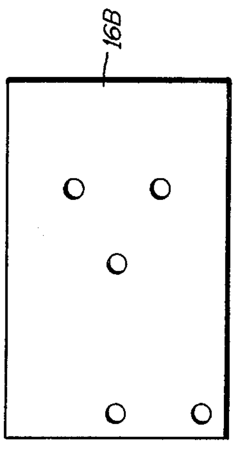

As heretofore stated each component is assigned a color card e.g. a red card 16R (FIGURE 4) for transistors T, a green color card 16G (FIGURE 5) for condensers C, and a blue color card 16B (FIGURE 6) for resistors R; it being understood that different colors may be employed for different types and values of components. Each color card is predrilled at all locations corresponding to the holes on the printed circuit board except those locations in which the components represented by the color are to be inserted. For example, with the printed circuit board mounted white light will appear at all holes. If the red transistor card 16R is located in the frame the holes that are to receive a transistor will appear red, i.e. holes 19R, as the card is not perforated at these locations, and all other holes will appear white. The cards may be inserted one at a time in turn or all at one time. With all color cards inserted, coded as shown, the light passing through the holes 19R in the printed circuit board corresponding to transistor locations will be red; the holes 19G corresponding to condenser locations will be green and those corresponding to resistor locations will be blue. As the components are placed in the holes the leads thereof will effectively block light transmission so that when all components of a particular type are inserted its color will be no longer visible and the assembler may mount the next type of component.

As will be understood the leads 25 of the components may be bent to facilitate their retention on the board until after all components are mounted and the board is removed for dip soldering of all the leads on the underside of the board to the conductive material in the holes 19 in a manner understood in the art.

As will now be appreciated, components may be mounted in printed circuit boards at proper locations thereon by an unskilled operator in assembly line fashion with a minimum of error.

It will also be appreciated that the frame 13 may be made adjustable to accommodate different sizes of printed circuit board and cards.

It should be understood that the foregoing disclosure relates to only a preferred embodiment of the invention and that it is intended to cover all changes and modifications of the example of the invention herein chosen for the purposes of the disclosure which do not constitute departures from the spirit and scope of the invention.

The invention claimed is:

1. A method of assembling components at predetermined locations on a circuit board having a plurality of holes defining component locations, comprising, placing said board over a light table whereby light shines through said holes, placing between said printed circuit board and light table a colored card assigned to a particular component and provided with perforations at all locations corresponding to the hole locations on said board except at those corresponding locations in which the components assigned to the particular color card are to be positioned whereby the holes opposite unperforated card areas will appear colored, and positioning the components assigned to said color in the colored holes.

2. A method of assembling components at predetermined locations on a circuit board having a plurality of holes defining component locations comprising, assigning a color to each like component to be mounted on said circuit board, perforating assigned color cards at all locations corresponding to the hole pattern in said board except those corresponding to the holes that are to receive the assigned components, placing said board and cards in a a frame one above the other on a light table so that holes in said board corresponding to like components will transmit their assigned color to an assembler, and positioning like components in holes transmitting their assigned color.

References Cited by the Examiner

UNITED STATES PATENTS

| | | | |
|---|---|---|---|
| 2,735,165 | 2/56 | Soref et al. | 29—407 |
| 2,906,016 | 9/59 | Cannon et al. | 29—407 |
| 2,959,848 | 11/60 | Savitt | 29—407 |

WHITMORE A. WILTZ, *Primary Examiner.*

THOMAS H. EAGER, *Examiner.*